United States Patent
Li et al.

(10) Patent No.: US 9,443,715 B2
(45) Date of Patent: Sep. 13, 2016

(54) METHOD AND DEVICE FOR MEASURING TEMPERATURE OF SUBSTRATE IN VACUUM PROCESSING APPARATUS

(71) Applicant: Advanced Micro-Fabrication Equipment Inc, Shanghai, Shanghai (CN)

(72) Inventors: Yousen Li, Shanghai (CN); Steven Lee, Shanghai (CN); David Zhehao Chen, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 636 days.

(21) Appl. No.: 13/888,330

(22) Filed: May 6, 2013

(65) Prior Publication Data

US 2013/0292370 A1    Nov. 7, 2013

(30) Foreign Application Priority Data

May 7, 2012 (CN) .......................... 2012 1 0138239

(51) Int. Cl.
*G01K 11/00* (2006.01)
*H01L 21/02* (2006.01)
(Continued)

(52) U.S. Cl.
CPC ......... *H01L 21/02104* (2013.01); *C23C 16/46* (2013.01); *G01K 11/00* (2013.01); *G01K 11/12* (2013.01)

(58) Field of Classification Search
USPC ................................................. 374/121, 141
See application file for complete search history.

(56) References Cited

U.S. PATENT DOCUMENTS 6,116,779 A * 9/2000 Johnson ................. G01K 11/14
374/120
8,152,365 B2 * 4/2012 Timans ................. G01J 5/0003
250/339.11
(Continued)

FOREIGN PATENT DOCUMENTS

CN    101258387 A    9/2008
CN    101802574 A    8/2010
(Continued)

OTHER PUBLICATIONS

Notice of Reasons for Rejection for Japanese Patent Application No. 2013-096785 dated Aug. 18, 2014.
(Continued)

*Primary Examiner* — Mirellys Jagan
(74) *Attorney, Agent, or Firm* — Nixon Peabody LLP; Joseph Bach, Esq.

(57) ABSTRACT

A method and device for determining temperature of a substrate in a vacuum processing apparatus during a process of the substrate are disclosed, the substrate to be measured is placed on a susceptor in the vacuum processing apparatus for a manufacture process, and the method includes: selecting i wavelengths from radiance emitted from the susceptor through a substrate, where i is a natural number greater than 1; obtaining at least i pieces of radiance corresponding to the selected i wavelengths; and calculating the temperature of the substrate based on the i pieces of radiance and the i wavelengths, by using a mathematical equation: $E(\lambda_i)=T(d) \times M(\lambda_i,T)$, where $E(\lambda_i)$ is the ith radiant quantity corresponding to the ith wavelength $\lambda_i$, $T(d)$ is transmittance of the substrate, which is a function of thickness d of a film grown on the substrate, and $M(\lambda_i,T)$ is blackbody radiation equation, which is a function of the ith wavelength $\lambda_i$ and the substrate temperature T.

20 Claims, 8 Drawing Sheets

(51) Int. Cl.
*C23C 16/46* (2006.01)
*G01K 11/12* (2006.01)

(56) References Cited

U.S. PATENT DOCUMENTS

| | | | |
|---|---|---|---|
| 2002/0066859 A1* | 6/2002 | Ino | G01J 5/0003 250/339.04 |
| 2007/0020784 A1 | 1/2007 | Timans | |
| 2007/0076780 A1* | 4/2007 | Champetier | G01J 5/0003 374/121 |
| 2010/0014555 A1 | 1/2010 | Twerdochlib | |
| 2010/0183045 A1 | 7/2010 | Nakahara et al. | |
| 2010/0246631 A1 | 9/2010 | Barlett et al. | |
| 2012/0231558 A1 | 9/2012 | Timans | |
| 2012/0307233 A1* | 12/2012 | Boguslavskiy | H01L 21/67109 356/43 |
| 2012/0327970 A1* | 12/2012 | Haw | G01J 5/06 374/121 |
| 2013/0343425 A1* | 12/2013 | Tas | G01J 5/0859 374/121 |
| 2014/0284316 A1* | 9/2014 | Ji | G01J 5/0007 219/385 |
| 2015/0025832 A1* | 1/2015 | Chen | G01J 5/0007 702/134 |

FOREIGN PATENT DOCUMENTS

| | | |
|---|---|---|
| JP | 06-137953 A | 5/1994 |
| JP | 11-67672 A | 3/1999 |
| JP | 2000-88655 A | 3/2000 |
| JP | 2001-0077167 A | 3/2001 |
| JP | 2002-122480 A | 4/2002 |
| JP | 2007-64857 A | 3/2007 |
| JP | 2007-212477 A | 8/2007 |
| JP | 2011-231388 A | 11/2011 |
| JP | 2012-79731 A | 4/2012 |

OTHER PUBLICATIONS

Office Action in Korean Patent Application No. 10-2013-0050985 dated Jul. 17, 2014.

Office Action for Chinese Patent Application No. 201210138239.6 dated Nov. 2, 2014.

Office Action for Taiwanese Patent Application No. 101151270 dated Mar. 26, 2015.

Oing Hsiao Chyang, "Researching for photonic crystal anti-reflective film," Master Thesis of Photoelectric Research Institute from National Central University, TW, Jun. 28, 2005.

* cited by examiner

METHOD AND DEVICE FOR MEASURING TEMPERATURE OF SUBSTRATE IN VACUUM PROCESSING APPARATUS

RELATED APPLICATION

This application claims priority to Chinese Patent Application No. 201210138239.6, filed on May 7, 2012, and the disclosure of which is hereby incorporated by reference herein in its entirety.

FIELD OF THE INVENTION

The invention relates to the field of semiconductor manufacture, and in particular to a method and a device for measuring temperature of a substrate in a vacuum processing apparatus.

BACKGROUND OF THE INVENTION

Various manufacture processes of semiconductors greatly depend on the substrate temperature. Therefore, the control of the substrate temperature is important in manufacturing a semiconductor, and performing a uniform temperature control on the substrate is especially important because the substrate has a certain size.

Particularly, the control of the substrate temperature is important for a Metal-Organic Chemical Vapor Deposition (MOCVD) reactor. MOCVD is an abbreviation of Metal-Organic Chemical Vapor Deposition. MOCVD is a new Vapor Phase Epitaxy growth technique developed based on the Vapor Phase Epitaxy (VPE) growth. In MOCVD, organic compounds of III family element and II family element, hydrides of V family element and VI family element, and the like are used as source material for growing a crystal, the Vapor Phase Epitaxy is performed on the base material in a manner of thermal decompose reaction, so as to grow various semiconductors of III-V family and II-VI family compounds and thin layers of single-crystal material of multi-solid solutions thereof.

In the manufacture process of MOCVD, multiple parameters, such as substrate temperature, pressure, flow speed of gas, are needed to be monitored and controlled, so as to achieve an expected epitaxial growth of a crystal. The control of the substrate temperature is particularly important, and the stability and accuracy of the substrate temperature will directly affect the effect of the manufacture process. In MOCVD, multiple substrates are usually provided on a susceptor, and the susceptor can rotate quickly and cooperate with a gas spray header provided in the upper chamber, for supplying a uniform and fast manufacture platform for batch manufacture processes. Therefore, in the manufacture process of MOCVD, the temperature is usually measured by using a non-contact measurement mechanism.

In the prior art, the temperature of the substrate is usually measured by using the principle of light reflection and transmission. FIG. 1 is a schematic diagram of a principle of measuring the temperature of a substrate in a MOCVD reactor in the prior art. An active emitting light source 101 is provided above a substrate S, for continuously emitting incident lights S11 onto the surface of the substrate S at a certain angle, and the incident light S11 is reflected by the surface of the substrate S, to obtain a reflected light S12' expected. Further, a detector 102 is provided above the substrate S, for capturing the reflected light S12'. Further, in the prior art, related means (not shown) will also be provided for obtaining the radiant quantity of the substrate S. The following equation is used:

$$E(\lambda_i) = T(d) \times M(\lambda_i, T),$$

where $E(\lambda_i)$ is the radiance emitted from the susceptor through the substrate S; $M(\lambda_i, T)$ is blackbody radiation equation, which is a function of any wavelength $\lambda_i$ selected from the radiance and the substrate temperature T; T(d) is the transmittance of the substrate, where T(d)=1−R, R is the reflectivity of the substrate S, which is calculated based on the incident light S11 emitted from the light source 101 and the reflected light S12' obtained above the substrate S.

However, referring to FIG. 1, there are multiple uncertain factors during the manufacture processes of the substrate. For example, in the MOCVD reactor, a batch of substrates S to be processed is placed on the susceptor (as shown in FIG. 1). In order to obtain uniformly distributed gas on the multiple substrates and other uniform conditions for manufacture, the susceptor is required to rotate in a high speed (500-900 revolutions per minute or even 1000 revolutions per minute) under the driving of a shaft provided under the susceptor. Because high temperature (such as 1200 degree Celsius) is required during the MOCVD manufacture process, the substrates S are only placed in grooves of the susceptor. The substrates S may be sloped during the rotation due to centrifugal force generated by the high-speed rotation. Further, during the manufacture process, patterns are generated on the surface of the substrate because multiple films are grown on the substrate by epitaxy, which causes the surface of the substrate uneven. The above factors will result in that the reflected light will not be detected in the expected path. However, the detector is generally fixed at the same position. Referring to FIG. 1, in the existing temperature measurement mechanism, the substrate S is usually regarded as an object which performs mirror reflection, thus the light source 101 and the detector 102 are provided axial-symmetrically with respect to and above the substrate S, and the reflected light will expectably return in the path S12', so that the reflected light will be exactly obtained by the detector 102. However, in fact, the reflected light will return in, for example, the path S12. Therefore, it is difficult to obtain the reflected light because the detected range of the detector 102 is limited. Therefore, the temperature measurement mechanism in the prior art will lead to big error.

Thus, a more stable and reliable temperature measurement mechanism for a substrate is needed in the field, and based on this consideration, the invention is proposed.

SUMMARY OF THE INVENTION

To solve the problems mentioned above, it is provided a temperature measurement method for a vacuum processing system according to the invention.

It is provided a method for determining temperature of a substrate in a vacuum processing apparatus according to a first aspect of the invention, the substrate to be measured is placed on a susceptor in the vacuum processing apparatus for a manufacture process, where the method includes:

selecting i wavelengths from radiance emitted from the susceptor through a substrate, where i is a natural number greater than 1;

obtaining at least i pieces of radiance corresponding to the selected i wavelengths; and calculating the temperature of the substrate based on the i pieces of radiance and the i wavelengths, by using a mathematical equation:

$$E(\lambda_i)=T(d)\times M(\lambda_i,T),$$

where $E(\lambda_i)$ is the ith radiant quantity, $T(d)$ is transmittance of the substrate, which is a function of thickness d of a film grown on the substrate, and $M(\lambda_i,T)$ is blackbody radiation equation, which is a function of the ith wavelength $\lambda_i$ and the temperature of the substrate T.

Further, the vacuum processing apparatus includes a Metal-Organic Chemical Vapor Deposition (MOCVD) reactor, and multiple films are grown on the substrate in the manufacture process of MOCVD by epitaxy, so that the substrate has a structure including a base material and the multiple films.

Further, the blackbody radiation equation is:

$$M(\lambda_i, T) = \frac{2\pi hc^2}{\lambda^5} \frac{1}{e^{hc/\lambda kT}-1},$$

where h is Planck constant, c is light speed, k is Boltzmann constant, $\lambda_i$ is the wavelength, and T is the substrate temperature.

Further, the transmittance of the substrate is determined by:

$$T(d)=1-R,$$

where R is refractive index,
the refractive index is determined by:

$$R=rr^*,$$

where r is amplitude reflectance, and $r^*$ is conjugation of r, the amplitude reflectance is determined by:

$$r = \frac{n_0 - Y}{n_{0+}Y},$$

where $n_0$ is refractive index of a medium in which the radiance is transmitted through the substrate, and Y is an equivalent refractive index:

$$Y = \frac{B}{C},$$

where B and C are determined by the following matrix:

$$\begin{pmatrix} B \\ C \end{pmatrix} = \begin{pmatrix} \cos\delta_1 & \frac{i\sin\delta_1}{\eta_1} \\ i\eta_1\sin\delta_1 & \cos\delta_1 \end{pmatrix} \begin{pmatrix} 1 \\ \eta_2 \end{pmatrix},$$

where $\eta_1$ and $\eta_2$ are determined by:
for a p-component, $\eta_1=\eta_1/\cos\theta$, and $\eta_2=n_2/\cos\theta$; and
for a s-component, $\eta_1=\eta_1\cos\theta$, and $\eta_2=n_2\cos\theta$,
$\theta$ is an angle between a direction in which the radiance is obtained and a normal, and $\delta_1$ is determined by:

$$\delta_1 = \frac{2\pi n_1 d_1}{\lambda_i}\cos\theta,$$

where $d_1$ represents thickness of the top film on the substrate, $\lambda_i$ represents the ith wavelength selected from the radiance, $n_1$ represents refractive index of the top film on the substrate, and $n_2$ represents an equivalent refractive index of the base material and the rest of films of the substrate.

Further, the method further includes: selecting any two wavelengths from the i wavelengths; and obtaining $C_i^2$ substrate temperature values T and $C_i^2$ film thickness values d, by substituting the selected two wavelengths for the wavelength in the mathematical equation: $E(\lambda_i)=T(d)\times M(\lambda_i,T)$.

Further, the method further includes: calculating average values of the $C_i^2$ substrate temperature values T and the $C_i^2$ film thickness values d respectively, to obtain a final substrate temperature value and a final film thickness value.

Further, the method further includes: comparing the measured substrate temperature with a pre-stored reference substrate temperature; and controlling the vacuum processing apparatus to adjust the current temperature of the substrate.

It is provided a device for determining temperature of a substrate in a vacuum processing apparatus according to a second aspect of the invention, the substrate to be measured is placed on a susceptor in the vacuum processing apparatus for a manufacture process, where the device includes:

a wavelength selecting means, adapted to select i wavelengths from radiance emitted from the susceptor through a substrate, where i is a natural number greater than 1;

a radiant quantity obtaining means, adapted to obtain at least i pieces of radiance corresponding to the selected i wavelengths; and a calculating and analyzing means, adapted to calculate the temperature of the substrate based on the i pieces of radiance and the i wavelengths, by using a mathematical equation: $E(\lambda_i)=T(d)\times M(\lambda_i,T)$, where $E(\lambda_i)$ is the ith radiant quantity, $T(d)$ is transmittance of the substrate, which is a function of thickness d of a film grown on the substrate, and $M(\lambda_i,T)$ is blackbody radiation equation, which is a function of the ith wavelength $\lambda_i$ and the substrate temperature T.

Further, the vacuum processing apparatus includes a Metal-Organic Chemical Vapor Deposition (MOCVD) reactor, and at least one film is grown on the substrate in the manufacture process of MOCVD by epitaxy, so that the substrate has a structure including a base material and the at least one film.

Further, the blackbody radiation equation is:

$$M(\lambda_i, T) = \frac{2\pi hc^2}{\lambda^5} \frac{1}{e^{hc/\lambda kT}-1},$$

where h is Planck constant, c is light speed, k is Boltzmann constant, $\lambda_i$ is the wavelength, and T is the substrate temperature.

Further, the transmittance of the substrate is determined by:

$$T(d)=1-R,$$

where R is refractive index,
the refractive index is determined by:

$$R=rr^*,$$

where r is amplitude reflectance, and $r^*$ is conjugation of r,
the amplitude reflectance is determined by:

$$r = \frac{n_0 - Y}{n_{0+}Y},$$

where $n_0$ is refractive index of a medium in which the radiance is transmitted through the substrate, and Y is an equivalent refractive index:

$$Y = \frac{B}{C},$$

where B and C are determined by:

$$\begin{pmatrix} B \\ C \end{pmatrix} = \begin{pmatrix} \cos\delta_1 & \frac{i\sin\delta_1}{\eta_1} \\ i\eta_1\sin\delta_1 & \cos\delta_1 \end{pmatrix} \begin{pmatrix} 1 \\ \eta_2 \end{pmatrix},$$

where $\eta_1$ and $\eta_2$ are determined by:
for a p-component, $\eta_1 = n_1/\cos\theta$, and $\eta_2 = n_2/\cos\theta$; and
for a s-component, $\eta_1 = n_1 \cos\theta$, and $\eta_2 = n_2 \cos\theta$,
$\theta$ is an angle between a direction in which the radiance is obtained and a normal, and $\delta_1$ is determined by:

$$\delta_1 = \frac{2\pi n_1 d_1}{\lambda_i} \cos\theta,$$

where $d_1$ represents thickness of the top film on the substrate, $\lambda_i$ represents the ith wavelength selected from the radiance, $n_1$ represents refractive index of the top film on the substrate, and $n_2$ represents an equivalent refractive index of the base material and the rest of films of the substrate.

Further, the calculating and analyzing means is connected to the MOCVD reactor, and is further adapted to: select any two wavelengths from the i wavelengths; and obtain $C_i^2$ substrate temperature values T and $C_i^2$ film thicknesses values d, by substituting the selected two wavelengths for the wavelength in the mathematical equation: $E(\lambda_i) = T(d) \times M(\lambda_i, T)$.

Further, the calculating and analyzing means is further adapted to: calculate average values of the $C_i^2$ substrate temperature values T and the $C_i^2$ film thickness values d respectively, to obtain a final substrate temperature value and a final film thickness value.

Further, a reference substrate temperature is pre-stored in the calculating and analyzing means, and the calculating and analyzing means is further adapted to: compare the measured substrate temperature with the pre-stored reference substrate temperature; and control the vacuum processing apparatus to adjust the current temperature of the substrate.

It is provided a device for determining temperature of a substrate in a vacuum processing apparatus according to a third aspect of the invention, the substrate to be measured is placed on a susceptor in the vacuum processing apparatus for a manufacture process, the vacuum processing apparatus includes a chamber, and an observation opening is provided on the top of the chamber, where the device includes:

an optical module, adapted to select i wavelengths from radiance emitted from the susceptor through a substrate, obtain at least i pieces of radiance corresponding to the selected i wavelengths, and convert an optical signal containing the i wavelengths and the i pieces of radiance into an electrical signal, where i is a natural number greater than 1;

an analog module, adapted to amplify and de-noise the electrical signal;

a digital synchronization module, adapted to perform a Digital to Analog (D/A) conversion and synchronization on the amplified and de-noised electrical signal; and a calculating and analyzing means in which a mathematical equation of $E(\lambda_i) = T(d) \times M(\lambda_i, T)$ is pre-stored, where the calculating and analyzing means is adapted to calculate the temperature of the substrate based on the i pieces of radiance and the i wavelengths, by using the mathematical equation: $E(\lambda_i) = T(d) \times M(\lambda_i, T)$, where $E(\lambda_i)$ is the ith radiant quantity, T(d) is transmittance of the substrate, which is a function of thickness d of a film grown on the substrate, and $M(\lambda_i, T)$ is blackbody radiation equation, which is a function of the ith wavelength $\lambda_i$ and the substrate temperature T.

Optically, the optical module includes:

a first lens, provided above the observation opening, and adapted to converge, direct and transmit to a spectroscope the radiance emitted from the susceptor through a substrate;

i-1 spectroscopes, adapted to divide the optical signal containing the radiance transmitted from the first lens into optical signals in different wavelength intervals;

i filters, adapted to select i wavelengths from the optical signals containing different wavelengths divided by the spectroscopes, and obtain at least i pieces of radiance corresponding to the selected i wavelengths from the optical signals;

i second lenses, adapted to converge and direct, to a plurality of sensors, the optical signals containing the i wavelengths and the at least i pieces of radiance corresponding to the i wavelengths; and i sensors, adapted to convert the optical signals transmitted from the i second lenses into electrical signals respectively, where the i filters, the i second lenses, and the i sensors are divided into i groups, one filter, one second lens and one sensor are connected in series in this order in each group, and the i groups output in parallel i electrical signals containing the i wavelengths and the at least i pieces of radiance corresponding to the i wavelengths.

Optically, the optical module includes:

a lens, provided above the observation opening, and adapted to converge, direct and transmit to a fiber the radiance emitted from the susceptor through a substrate;

an optical fiber, connected to the lens, and adapted to transmit the radiance transmitted from the lens to i filters;

the i filters, adapted to select i wavelengths from the optical signals containing different wavelengths, and obtain at least i pieces of radiance corresponding to the selected i wavelengths from the optical signals; and i sensors, adapted to convert the optical signals transmitted from the i filters into electrical signals respectively, where the i filters and the i sensors are divided into i groups, one filter and one sensor are connected in series in this order in each group, and the i groups output in parallel i electrical signals containing the i wavelengths and the at least i pieces of radiance corresponding to the i wavelengths.

Further, the analog module includes:

i amplifiers, adapted to amplify the electrical signals transmitted from the optical module; and i filters, adapted to de-noise the amplified electrical signals, where the i amplifiers and the i filters are divided into i groups, one amplifier and one filter are connected in series in this order in each group, and the i groups output in parallel i analog electrical signals containing the i wavelengths and the at least i pieces of radiance corresponding to the i wavelengths.

Further, the digital synchronization module includes:

i Analog to Digital (A/D) converters, connected to the analog module and adapted to convert the analog electrical signals transmitted from the analog module into digital signals respectively; and a Field Programmable Gate Array (FPGA), connected to the i A/D converters and adapted to synchronize the digital signals.

Further, the vacuum processing apparatus includes a Metal-Organic Chemical Vapor Deposition (MOCVD) reactor, and at least one film is grown on the substrate in the manufacture process of MOCVD by epitaxy, so that the substrate has a structure including a base material and the at least one film.

Further, the blackbody radiation equation is:

$$M(\lambda_i, T) = \frac{2\pi hc^2}{\lambda^5} \frac{1}{e^{hc/\lambda kT} - 1},$$

where h is Planck constant, c is light speed, k is Boltzmann constant, $\lambda_i$ is the wavelength, and T is the substrate temperature.

Further, the transmittance of the substrate is determined by:

$T(d)=1-R$, where R is refractive index, the refractive index is determined by:

$R=rr^*$, where r is amplitude reflectance, and r* is conjugation of r, the amplitude reflectance is determined by:

$$r = \frac{n_0 - Y}{n_{0+}Y},$$

where $n_0$ is refractive index of a medium in which the radiance is transmitted through the substrate, and Y is an equivalent refractive index:

$$Y = \frac{B}{C},$$

where B and C are determined by the following matrix:

$$\begin{pmatrix} B \\ C \end{pmatrix} = \begin{pmatrix} \cos\delta_1 & \frac{i\sin\delta_1}{\eta_1} \\ i\eta_1\sin\delta_1 & \cos\delta_1 \end{pmatrix} \begin{pmatrix} 1 \\ \eta_2 \end{pmatrix},$$

where $\eta_1$ and $\eta_2$ are determined by:

for a p-component, $\eta_1=n_1/\cos\theta$, and $\eta_2=n_2/\cos\theta$; and for a s-component, $\eta_1=n_1\cos\theta$, and $\eta_2=n_2\cos\theta$, θ is an angle between a direction in which the radiance is obtained and a normal, and $\delta_1$ is determined by:

$$\delta_1 = \frac{2\pi n_1 d_1}{\lambda_i}\cos\theta,$$

where $d_1$ represents thickness of the top film on the substrate, $\lambda_i$ represents the ith wavelength selected from the radiance, $n_1$ represents refractive index of the top film on the substrate, and $n_2$ represents an equivalent refractive index of the base material and the rest of films of the substrate.

Further, the calculating and analyzing means is connected to the MOCVD reactor, and is further adapted to: select any two wavelengths from the i wavelengths; and obtain $C_i^2$ substrate temperature values T and $C_i^2$ film thickness values d, by substituting the selected two wavelengths for the wavelength in the mathematical equation: $E(\lambda_i)=T(d)\times M(\lambda_i, T)$.

Further, the calculating and analyzing means is further adapted to: calculate average values of the $C_i^2$ substrate temperature values T and the $C_i^2$ film thickness values d respectively, to obtain a final substrate temperature value and a final film thickness value.

Further, a reference substrate temperature is pre-stored in the calculating and analyzing means, and the calculating and analyzing means is further adapted to: compare the measured substrate temperature with the reference substrate temperature; and control the vacuum processing apparatus to adjust the current temperature of the substrate.

The substrate temperature measurement mechanism according to the invention has high accuracy, better reliability, and is particularly adapted to control, in a non-contact manner, the temperature of the substrate rotating in a high speed during a manufacture process of high temperature in the MOCVD reactor.

BRIEF DESCRIPTION OF THE DRAWINGS

In the drawings, the same or similar reference numeral denotes the same or similar step feature/means (module).

DETAILED DESCRIPTION OF THE INVENTION

As compared with the prior art, the temperature measurement mechanism of the substrate according to the invention does not need to calculate the temperature of the substrate by irradiating lights onto the substrate using a fixed active incident light source and by the reflection of the lights. In the invention, the temperature of the substrate and other related parameters can be calculated based on the radiant quantity of the substrate and the wavelength obtained from the radiance by using a mathematical equation, where the blackbody radiation principle is used and the susceptor is used as a blackbody.

The embodiments of the invention will be described in conjunction with the drawings.

It is provided a method for determining temperature of a substrate in a vacuum processing apparatus according to a first aspect of the invention. It should be understood by those skilled in the art that the invention can be applied to any vacuum processing apparatus which needs to measure or control the temperature of the substrate, including but not limited to a Metal-Organic Chemical Vapor Deposition (MOCVD) reactor, a etching reactor, or a chemical film growth reactor. Preferably, the invention is applied to the MOCVD reactor.

The mechanism of the invention will be described by taking the MOCVD reactor as an example.

Figure 1:
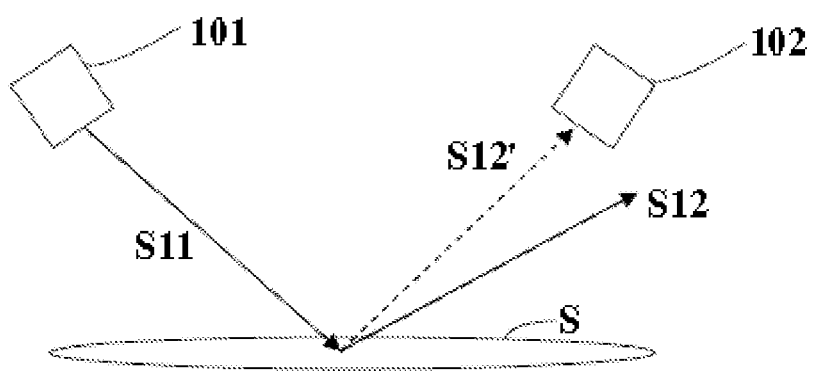
FIG. 1 is a schematic diagram of a principle of measuring the temperature of a substrate in a Metal-Organic Chemical Vapor Deposition (MOCVD) reactor in the prior art.
Figure 2:
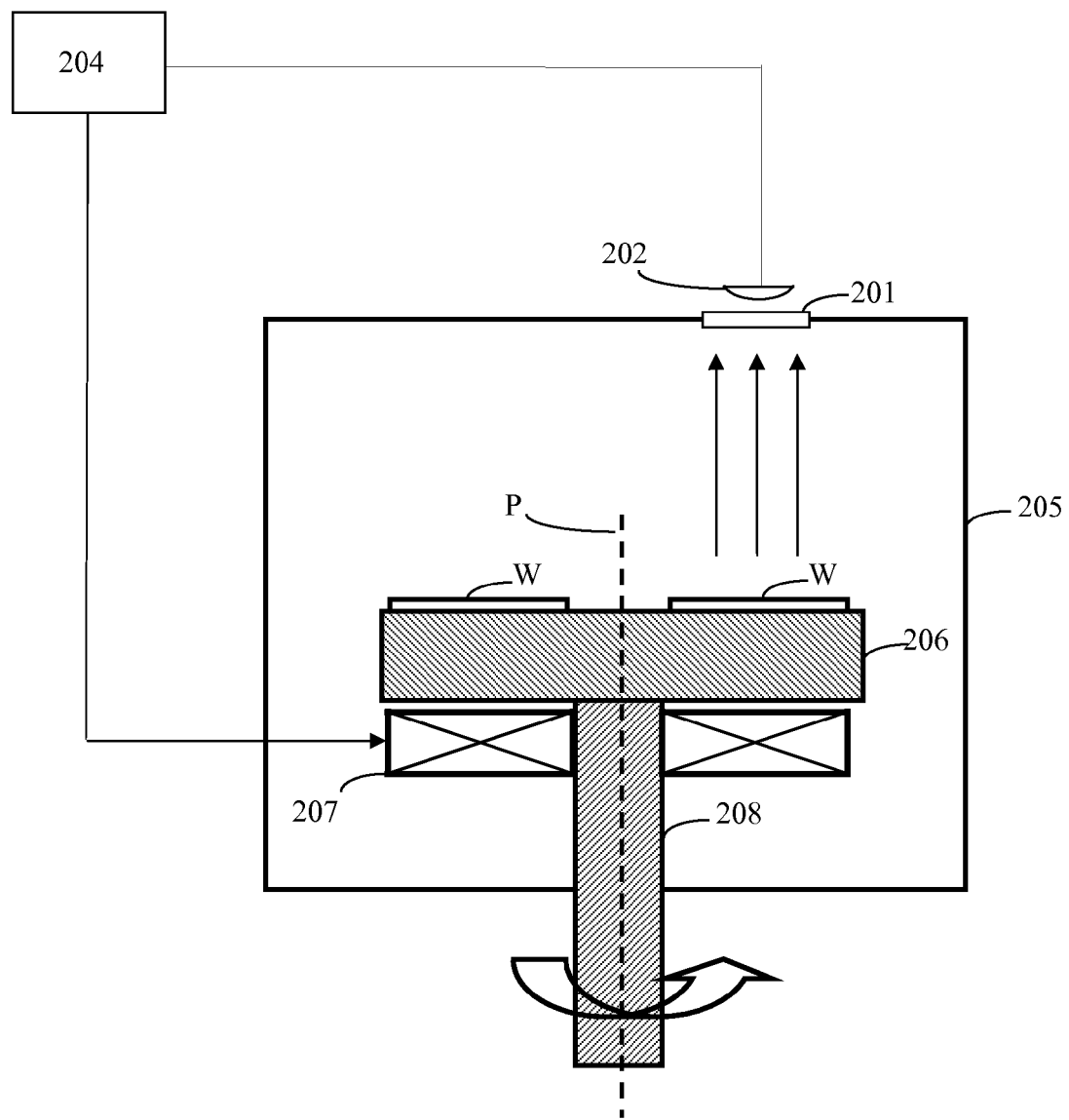
FIG. 2 is a schematic diagram of a principle of measuring the temperature of a substrate in an MOCVD reactor according to an embodiment of the invention.

FIG. 2 is a schematic diagram of a principle of measuring the temperature of a substrate in an MOCVD reactor according to an embodiment of the invention. The MOCVD reactor includes a reaction chamber 205, and at least one susceptor 206 and a rotation shaft 208 for supporting the susceptor 206 are provided inside the reaction chamber 205. The rotation shaft 208 can rotate in a high speed such as 500-1000 revolutions per minute under the driving of other power means (not shown), so that the susceptor 206 can also rotate in a high speed under the driving of the rotation shaft 208, that is, rotate by taking the vertical dotted line p shown in FIG. 2 as a shaft. Several substrates W to be processed are placed on the upper surface of the susceptor 206. To place the substrates W, several grooves or recesses (not shown) for placing the substrates W to be processed are provided on the upper surface of the susceptor 206. A heating means 207 is further provided inside the reaction chamber 205, for maintaining the temperature of the susceptor 206 at manufacture temperature, such as 1200 degree Celsius. The substrate W includes a base material and one or more films on the base material. In the embodiment as shown in the drawing, the substrate W is exemplified by taking sapphire as the base material, on which one or more films are grown by epitaxy in the MOCVD manufacture process, so that the substrate has a structure including the base material and the films.

An observation opening 201 is provided at a proper position of the reaction chamber 205, such as the top of the reaction chamber. A lens 202 is further provided above the observation opening 201. The lens 202 is further connected to several means (exemplified as the set of means 204 in the drawing), for measuring the temperature of the substrate and other parameters. It is to be noted that the set of means 204 is not a specific means, but is provided only for convenient description and illustration, and it can be seemed as a set of several hardware means. For example, the set of means 204 further includes an optical fiber, a filter, a lens, an amplifier, an analog to digital (A/D) converter, a Field Programmable Gate Array (FPGA), a Micro-programmed Control Unit (MCU) and the like, which have architectures and functions that will be described in detail hereinafter in conjunction with FIG. 4(a) and FIG. 4(b).

Figure 4A:
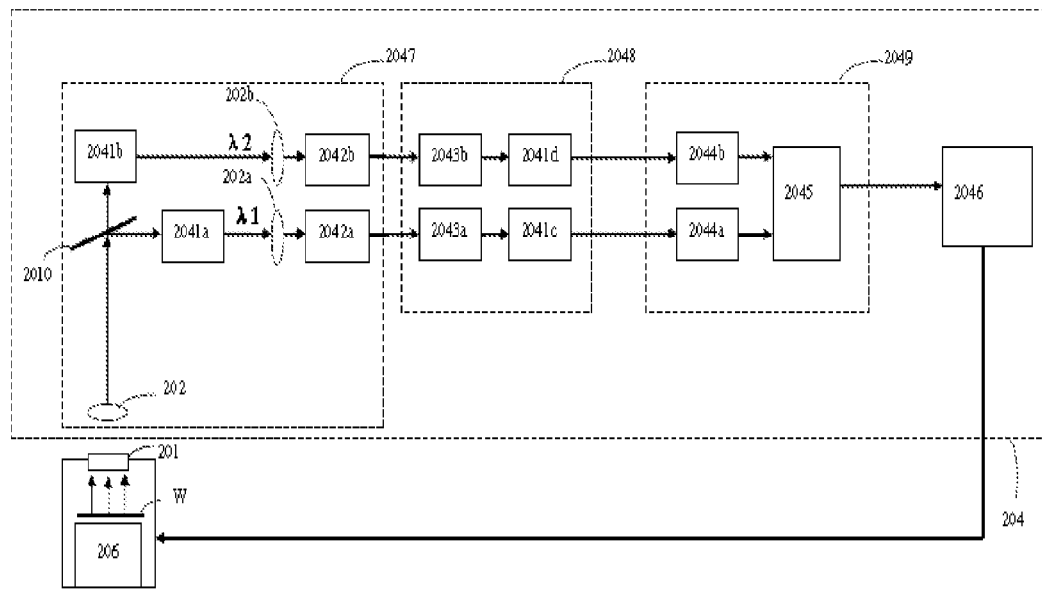
FIG. 4(a) is an amplified diagram of a detailed structure of a set of means and a schematic diagram of a connection relation of an MOCVD reactor according to an embodiment of the invention.
Figure 4B:
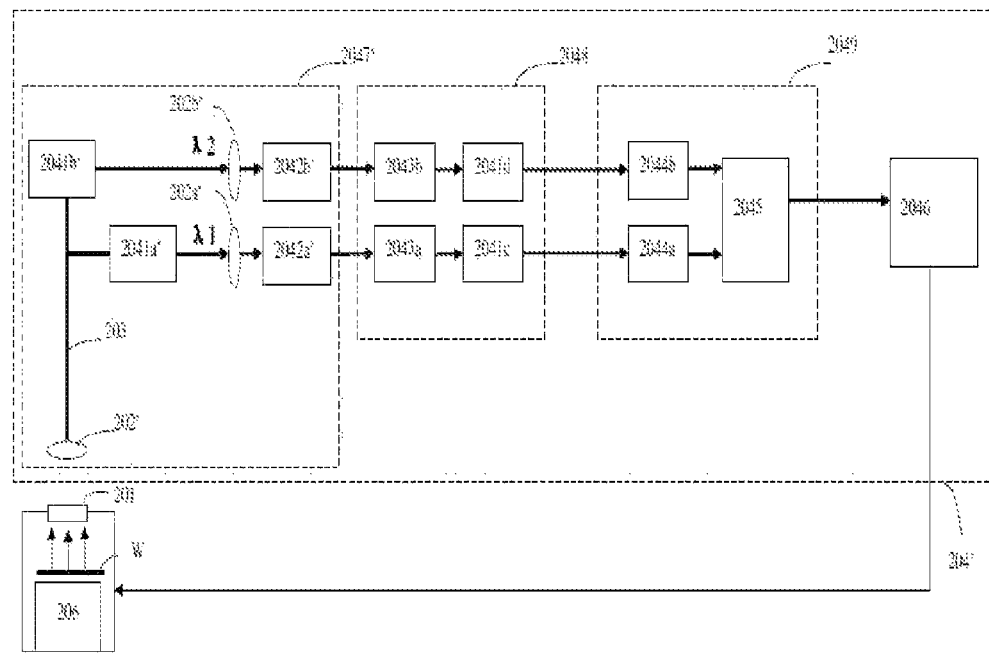
FIG. 4(b) is an amplified diagram of a detailed structure of a set of means and a schematic diagram of a connection relation of an MOCVD reactor according to another embodiment of the invention.

It is to be noted that although the set of means 204 in FIG. 4(a) and FIG. 4(b) includes an optical module 2047/2047', an analog module 2048, a digital synchronization module 2049 and a calculating and analyzing module 2046, it should be understood by those skilled in the art that the optical module 2047/2047', the analog module 2048, the digital synchronization module 2049 and the calculating and analyzing module 2046 can also be integrated in a single module/system/means which has all functions of the above modules.

Figure 3:
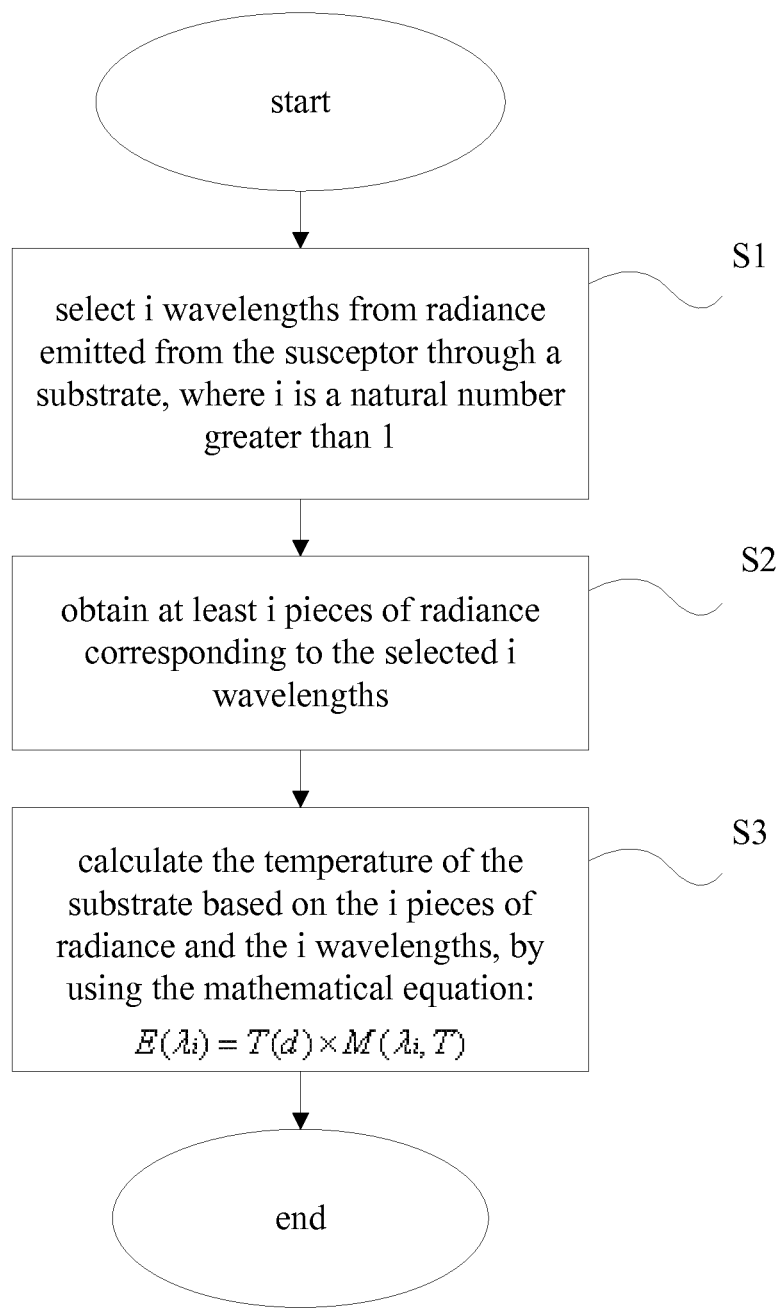
FIG. 3 is a flowchart of a method for measuring the temperature of a substrate according to an embodiment of the invention.

FIG. 3 is a flowchart of a method for measuring the temperature of a substrate according to an embodiment of the invention. It is provided a method for determining temperature of a substrate in a vacuum processing apparatus according to the invention, the substrate to be measured is placed on a susceptor in the vacuum processing apparatus for a manufacture process, where the method includes the following step S1 to step S3:

Step S1, selecting i wavelengths from radiance emitted from the susceptor through a substrate, where i is a natural number greater than 1;

Step S2, obtaining at least i pieces of radiance corresponding to the selected i wavelengths; and Step S3, calculating the temperature of the substrate based on the i pieces of radiance and the i wavelengths, by using a mathematical equation $E(\lambda_i)=T(d) \times M(\lambda_i,T)$, in a manner of simultaneous equations, where $\lambda_i$ is the ith wavelength, T is the temperature of the substrate, $E(\lambda_i)$ is the ith radiant quantity corresponding to the ith wavelength $\lambda_i$, T(d) is transmittance of the substrate, which is a function of thickness d of a film grown on the substrate, and $M(\lambda_i,T)$ is blackbody radiation equation, which is a function of the ith wavelength $\lambda_i$ and the substrate temperature T.

According to a preferable embodiment of the invention, i=2, and the method for measuring the temperature of the substrate includes the following steps:

Firstly, step S1 is performed, to select 2 wavelengths from radiance emitted from the susceptor 206 through the substrate W;

Then step S2 is performed, to obtain 2 pieces of radiance corresponding to the selected 2 wavelengths, and then step S3 is performed, to calculate the temperature of the substrate T.

The method for obtaining, by a hardware means, other parameters required to calculate the temperature of the substrate T will be described in the following.

It is to be understood that, according to the blackbody radiation principle, the susceptor 206, as a blackbody, will emit radiance to the outside. Referring to FIG. 2, the total radiance (shown by the arrows) emitted from the susceptor 206 through a substrate W is transmitted to the first lens 202 via the observation opening 201 of the reactor, and the first lens 202 directs the radiance to the set of means 204.

FIG. 4(a) is an amplified diagram of a detailed structure of a set of means 204 and a schematic diagram of a connection relation of an MOCVD reactor according to an embodiment of the invention. The set of means 204 includes the optical module 2047, the analog module 2048, the digital synchronization module 2049 and the calculating and analyzing module 2046.

It should be understood by those skilled in the art that the total radiance emitted from the susceptor 206 through a substrate W is propagated in the form of light. According to an embodiment of the invention, the optical module 2047 selects the wavelengths $\lambda_1$ and $\lambda_2$ and the pieces of radiance $E(\lambda_1)$ and $E(\lambda_2)$ corresponding to the wavelengths by a configuration of a spectroscope and a filter. The first lens 202 converges and directs optical signals containing the total radiance to a spectroscope 2010 which can transmit the light with the transmittance greater than a predetermined wavelength and reflect the light with the transmittance less than the predetermined wavelength, so that lights with different wavelengths can be divided. As shown in FIG. 4(a), in order to select the optical signals having the wavelengths of $\lambda_1$ and $\lambda_2$ (where $\lambda_2 > \lambda_1$) and the wavelengths $\lambda_1$ and $\lambda_2$, the spectroscope 2010 is configured to transmit the optical signal having the wavelength greater than $$\frac{\lambda_1 + \lambda_2}{2}$$

to a first filter 2041b and reflect the optical signal having the wavelength less than $$\frac{\lambda_1 + \lambda_2}{2}$$

to a first filter 2041a. The first filter 2041a is configured to select the optical signal having the wavelength of $\lambda_1$, and the first filter 2041b is configure to select the optical signal having the wavelength of $\lambda_2$.

The first filters 2041a and 2041b are connected to a second lens 202a and a second lens 202b respectively, which are in turn connected to a sensor 2042a and a sensor 2042b respectively. The second lenses 202a and 202b converge and direct the optical signals having the wavelengths of $\lambda_1$ and $\lambda_2$ to the sensors 2042a and 2042b respectively, and the sensors 2042a and 2042b may convert the optical signals into electrical signals. Thus, the two optical signals respectively having the wavelengths of $\lambda_1$ and $\lambda_2$ are converted into electrical signals by the sensors 2042a and 2042b and transmitted to the analog module 2048, with the electrical signals being analog signals.

Further, the analog module 2048 includes two amplifiers and two filters. The analog electrical signals respectively having the wavelengths of $\lambda_1$ and $\lambda_2$ are amplified by the amplifiers 2043a and 2043b, then de-noised by the second filters 2041c and 2041d, and transmitted to the digital synchronization module 2049.

Further, the digital synchronization module 2049 includes two A/D converters 2044a and 2044b and a FPGA 2045. The analog electrical signals respectively having the wavelengths of $\lambda_1$ and $\lambda_2$ are amplified and de-noised by the analog module 2048, and then converted to digital signals by the A/D converters 2044a and 2044b. Then, the digital signals respectively having the wavelengths of $\lambda_1$ and $\lambda_2$ are synchronized by the FPGA 2045, and transmitted to the calculating and analyzing means 2046 for calculating and analyzing. The calculating and analyzing means 2046 is typically a micro-programmed processor or a micro-programmed controller.

The set of means 204 may have different implementations. FIG. 4(b) is an amplified diagram of a detailed structure of a set of means and a schematic diagram of an MOCVD reactor according to another embodiment of the invention, which is different from the embodiment shown in FIG. 4(a) in the optical module. The optical module 2047' shown in FIG. 4(b) selects the pieces of radiance $E(\lambda_1)$ and $E(\lambda_2)$ and the wavelengths $\lambda_1$ and $\lambda_2$ by a configuration of an optical fiber and a filter. The first lens 202' is connected to the optical fiber 203 directly, and the optical fiber 203 is in turn connected to the first filters 2041a' and 2041b'. Thus, the radiance emitted from the susceptor 206 through a substrate W is converged and directed to the optical fiber 203 by the first lens 202', and the optical signals containing the radiance are transmitted to the first filters 2041a' and 2041b' by the optical fiber 203. Optical signals respectively having the wavelengths of $\lambda_1$ and $\lambda_2$ are filtered out directly by the first filters 2041a' and 2041b'. The first filters 2041a' and 2041b' are connected to the second lenses 202a' and 202b' respectively, and the second lenses 202a' and 202b' are in turn connected to the sensors 2042a' and 2042b'. The second lenses 202a' and 202b' converge and direct the optical signals respectively having the wavelengths of $\lambda_1$ and $\lambda_2$ to the sensors 2042a' and 2042b', and the sensors 2042a' and 2042b' can convert the optical signals into electrical signals. Thus, the two optical signals having the wavelengths of $\lambda_1$ and $\lambda_2$ are converted into electrical signals by the sensors 2042a' and 2042b' respectively, then transmitted to the analog module 2048 for amplifying and de-noising, then transmitted to the digital synchronization module 2049 for A/D conversion and synchronization, and finally transmitted to the calculating and analyzing means 2046.

It is to be noted that, it has been described that the radiance emitted from the susceptor 206 through a substrate W is optical signals, and the optical signals are converted into digital signals by a series of signal processes, where the digital signals contain the wavelengths $\lambda_1$ and $\lambda_2$ and the pieces of radiance $E(\lambda_1)$ and $E(\lambda_2)$ corresponding to the wavelengths $\lambda_1$ and $\lambda_2$. The digital signals containing the pieces of radiance $E(\lambda_1)$ and $E(\lambda_2)$ carry the wavelengths $\lambda_1$ and $\lambda_2$, and vice versa. Therefore, the pieces of radiance $E(\lambda_1)$ and $E(\lambda_2)$ and the wavelengths $\lambda_1$ and $\lambda_2$ required by the substrate temperature measurement mechanism of the invention for calculating and analyzing are obtained.

Finally, step S3 is performed, to calculate the substrate temperature T based on the pieces of radiance $E(\lambda_1)$ and $E(\lambda_2)$ and the wavelengths $\lambda_1$ and $\lambda_2$ by using the mathematical equation: $E(\lambda_i) = T(d) \times M(\lambda_i, T)$. The above calculating and analyzing processes are performed in the calculating and analyzing means 2046. The mathematical equation is pre-stored in the calculating and analyzing means 2046.

$$E(\lambda_i) = T(d) \times M(\lambda_i, T)$$

where $\lambda_i$ is the ith wavelength, T is the temperature of the substrate, $E(\lambda_i)$ is the ith radiant quantity corresponding to the ith wavelength $\lambda_i$, T(d) is transmittance of the substrate, which is a function of thickness d of a film grown on the substrate, and $M(\lambda_i, T)$ is blackbody radiation equation, which is a function of the ith wavelength $\lambda_i$ and the substrate temperature T.

$$M(\lambda_i, T) = \frac{2\pi hc^2}{\lambda^5} \frac{1}{e^{hc/\lambda kT} - 1}$$

where h is Planck constant, c is light speed, k is Boltzmann constant, $\lambda_i$ is the wavelength, and T is seemed as the substrate temperature.

It is to be noted that in the blackbody radiation equation $$M(\lambda_i T) = \frac{2\pi hc^2}{\lambda^5} \frac{1}{e^{hc/\lambda kT} - 1},$$

the actual meaning of T is the temperature of the object that emits the radiance, which is actually the temperature of the susceptor in the above embodiment. However, in this invention, it is considered that the susceptor and the substrate are heat-conductive, and have such heat-conduction levels that the temperatures of the susceptor and the substrate can be regarded as the same, or the difference between the temperatures of the susceptor and the substrate can be ignored.

Figure 5:
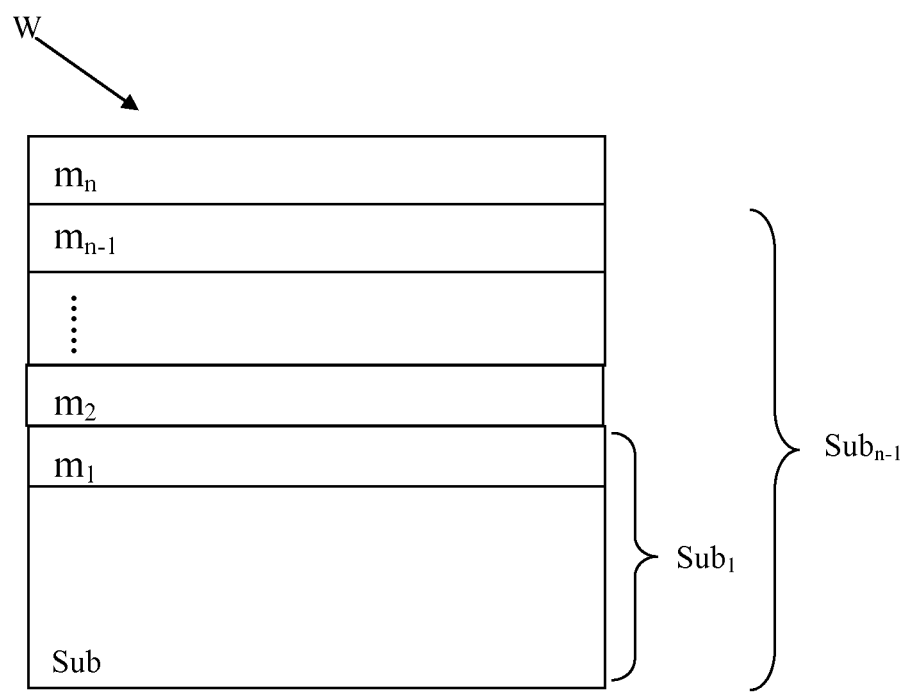
FIG. 5 is a schematic structural diagram of a substrate having a structure including multiple films according to an embodiment of the invention.

FIG. 5 is a schematic structural diagram of a substrate having a structure including multiple films according to an embodiment of the invention. The process for calculating the refractive index T(d) of the substrate will be described in conjunction with FIG. 5. In the case that the substrate has the structure including a base material and multiple films due to the epitaxial growth of the multiple film materials on the substrate in the manufacture process, the refractive index T(d) of the substrate is an equivalent refractive index.

Specifically, when the base material of the substrate sub is for example a sapphire, it is assumed that a first film material $m_1$ is grown on it by epitaxy, then it should be understood by those skilled in the art that the refractive index $T_1(d)$ can be calculated based on the refractive indexes of the base material of the sapphire sub, the first film material $m_1$ and the air. Therefore, the calculation way of the invention is that: when a second film material $m_2$ is further grown on the film material $m_1$ by epitaxy, the first film material $m_1$ and the base material of the sapphire sub can be used as the first equivalent base material $sub_1$, then the second equivalent refractive index $T_2(d)$ of the substrate on which two films are grown by epitaxy can be calculated based on the refractive indexes of the first equivalent base material $sub_1$, the second film material $m_2$ and the air, where the refractive index $T_1(d)$ of the first equivalent base material $sub_1$ has been calculated in the first step. And in a similar way, when n film materials are grown on the substrate by epitaxy, the first to the n−1th films and the base material of the sapphire sub can be used as the n−1th equivalent base material $sub_{n-1}$, then the refractive index $T_n(d)$ of the substrate on which n films are grown by epitaxy can be calculated based on the refractive indexes of the n−1th equivalent base material $sub_{n-1}$, the nth film material and the air.

Specifically, if n film materials are grown on the substrate by epitaxy, the current transmittance $T_n(d)$ of the substrate can be determined by:

$$T_n(d)=1-R,$$

where R is the refractive index,
the refractive index R is determined by:

$$R=rr^*,$$

where r is the amplitude reflectance, and r* is conjugation of r,
the amplitude reflectance r is determined by:

$$r = \frac{n_0 - Y}{n_0 + Y},$$

where $n_0$ is the refractive index of a medium in which the radiance emitted from the susceptor through the substrate is transmitted, and is the refractive index of the air in this embodiment, that is, $n_0=1$. Y is an equivalent refractive index of the substrate on which n films are grown by epitaxy:

$$Y = \frac{B}{C},$$

where B and C are determined by the following matrix:

$$\begin{pmatrix} B \\ C \end{pmatrix} = \begin{pmatrix} \cos\delta_1 & \frac{i\sin\delta_1}{\eta_1} \\ i\eta_1\sin\delta_1 & \cos\delta_1 \end{pmatrix} \begin{pmatrix} 1 \\ \eta_2 \end{pmatrix},$$

where $\eta_1$ and $\eta_2$ are determined by:
for a p-component, $\eta_1=n_1/\cos\theta$, and $\eta_2=n_2/\cos\theta$; and
for a s-component, $\eta_1=n_1\cos\theta$, and $\eta_2=n_2\cos\theta$, θ is an angle between a direction in which the radiance is obtained and a normal, and $\delta_1$ is determined by:

$$\delta_1 = \frac{2\pi n_1 d_1}{\lambda_i}\cos\theta,$$

where it should be understood by those skilled in the art that the light is propagated in the form of optical waves, and the above p-component and s-component refer to two components of the optical wave in different directions. θ is the angle between the optical signal containing the radiance and the normal, that is, the incident angle, referring to FIG. 3 and FIGS. 4(a) and 4(b). In this embodiment, in an ideal state, the radiance is obtained in the direction perpendicular to the substrate, that is, the radiance emitted from the susceptor through a substrate is obtained in only the vertical direction (as shown by the vertical arrows in FIG. 3 and FIGS. 4(a) and 4(b)), thus θ=0.

If n films are grown on the substrate by epitaxy, $d_1$ represents the thickness of the top film, i.e., the nth film, $\lambda_i$ represents the ith wavelength selected from the radiance, $n_1$ represents the refractive index of the nth film, and $n_2$ represents the refractive index of the n−1th equivalent base material. $n_1$ is determined based on the material which the film is formed of, and $n_2$ has been calculated in the previous step.

It is to be noted that, by using the method for calculating the equivalent refractive index according to the invention, current refractive index of the substrate having the structure of multiple films can be calculated in real time/at any time. It is unnecessary to use the end point of the epitaxial growth of each film material as the node for the calculation, and the calculation can be performed even when only part of a film is grown by epitaxy. For example, if it is required by the procedure to perform the calculation when one third of the nth film material is grown by epitaxy, the one third of the film material can be used as the top film, and the first to the n−1th films and the base material of the sapphire can be used as the equivalent base material.

In the above embodiment, every time a new film is grown by epitaxy, all the previous films and the base material are used as the equivalent base material, and the mathematical calculation is performed based on this. However, it should be understood by those skilled in the art that all the films grown by epitaxy on the substrate can be seemed as a single film, and the calculation can be performed by using the above equation. For conciseness, it is different from the above embodiment only in the calculation order, and the calculation process thereof will not be described in detail here. It is to be noted that all embodiments utilizing the above equation, no matter what the calculation order is, should fall within the protection scope of the invention.

In the embodiment, i=2, that is, two wavelengths $\lambda_1$ and $\lambda_2$ are substituted for the wavelength in the above mathematical equation respectively:

$$E(\lambda_1)=T(d)\times M(\lambda_1,T) \text{ and}$$

$$E(\lambda_2)=T(d)\times M(\lambda_2,T),$$

where $E(\lambda_1)$ and $E(\lambda_2)$ can be obtained in step S1 as described above, then only the temperature value T and the film thickness value d are unknown in the two equations, and the temperature value T and the film thickness value d can be obtained by solving the set of the equations.

Further, when i>2, any two wavelengths are selected from the i wavelengths and substituted for the wavelength in the mathematical equation $E(\lambda_i)=T(d)\times M(\lambda_i,T)$. For each two wavelengths, one set of equations are obtained, so $C_i^2$ sets of equations are obtained in total, and $C_i^2$ substrate temperature values T and $C_i^2$ film thicknesses values d can be obtained finally.

Preferably, the average values of the $C_i^2$ substrate temperature values T and the $C_i^2$ film thickness values d are calculated respectively, to obtain a final substrate temperature value and a final film thickness value.

Figure 4C:
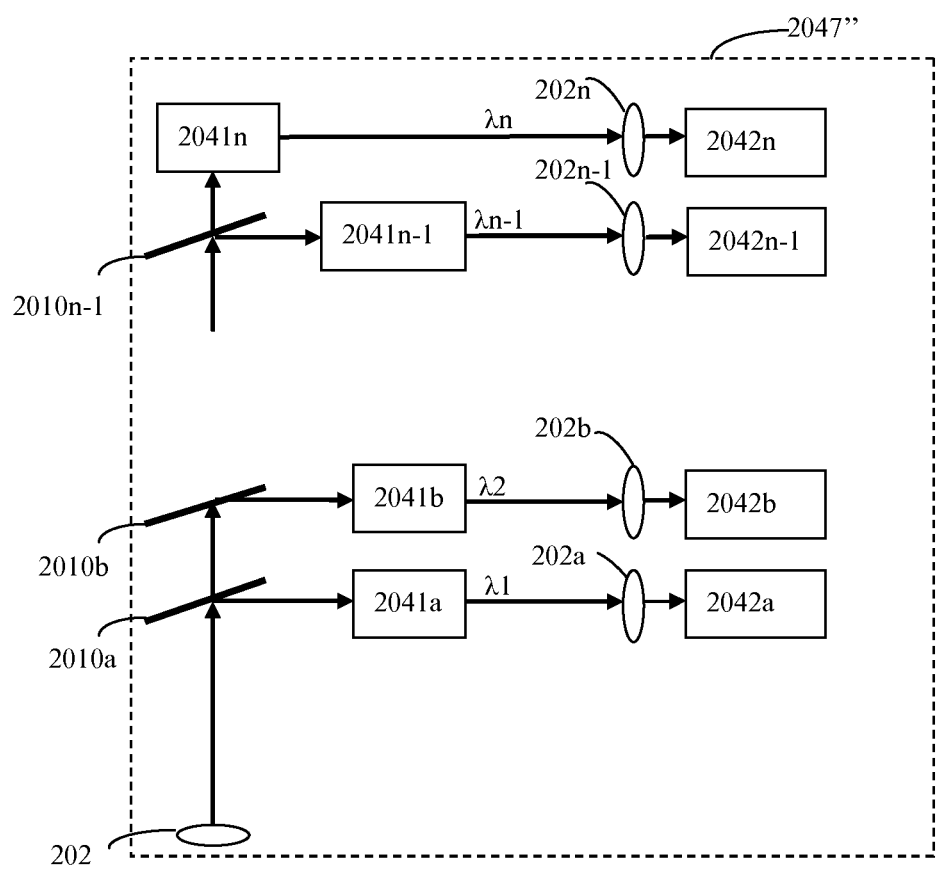
FIG. 4(c) is an amplified diagram of a detailed structure of an optical module of a set of means according to yet another embodiment of the invention.

It is to be noted that, if it is required to select wavelengths for i>2, the pieces of radiance of the multiple wavelengths and the multiple wavelengths can be obtained by a configuration of multiple stages of spectroscopes and the cooperation of the related hardware followed such as the filter, the lens and the sensor. FIG. 4(c) is an amplified diagram of a detailed structure of an optical module 2047" of a set of means 204 according to yet another embodiment of the invention. According to a variation of the above embodiment, another spectroscope 2010b is further connected in parallel with the spectroscope 2010a. Therefore, the optical signals containing the radiance emitted from the susceptor through a substrate are transmitted to the spectroscope 2010a. The spectroscope 2010a reflects the optical signal having the wavelength less than $$\frac{\lambda_1 + \lambda_2}{2}$$

to a filter 2041a, which may select the optical signal having the wavelength of $\lambda_1$. Meanwhile, the spectroscope 2010a further transmits the optical signal having the wavelength greater than $$\frac{\lambda_1 + \lambda_2}{2}$$

to the spectroscope 2010b. Further, the spectroscope 2010b is configured to transmit the optical signal having the wavelength greater than $$\frac{\lambda_2 + \lambda_3}{2}$$

to a subsequent spectroscope, and reflect the optical signal having the wavelength less than $$\frac{\lambda_2 + \lambda_3}{2}$$

to a filter 2041b which may select the optical signal having the wavelength of $\lambda_2$. In a similar way, in the invention, multiple spectroscopes may be connected in parallel with the spectroscope 2010b, until the spectroscope 2010n-1, the spectroscope 2010n. As shown in FIG. 4(c), the spectroscopes 2010a-2010n are further connected with the filters 2041a-2041n respectively, the filters 2041a-2041n are in turn connected with the second lenses 202a-202n respectively, and the second lenses 202a-202n are in turn connected with the sensors 2042a-2042n respectively, so that the optical signals having the wavelengths of $\lambda_1, \lambda_2, \ldots, \lambda n-1$, and $\lambda n$ can be selected, and the optical signals are converted into electrical signals and then transmitted in parallel to a subsequent analog module (not shown).

It is to be noted that according to the mechanism of the invention, the more the selected wavelengths, the higher the accuracy of the calculation, but the more complex the algorithm, and the slower the speed of the calculation. Thus, the manufacture process may be optimized as required in practice.

Figure 6:
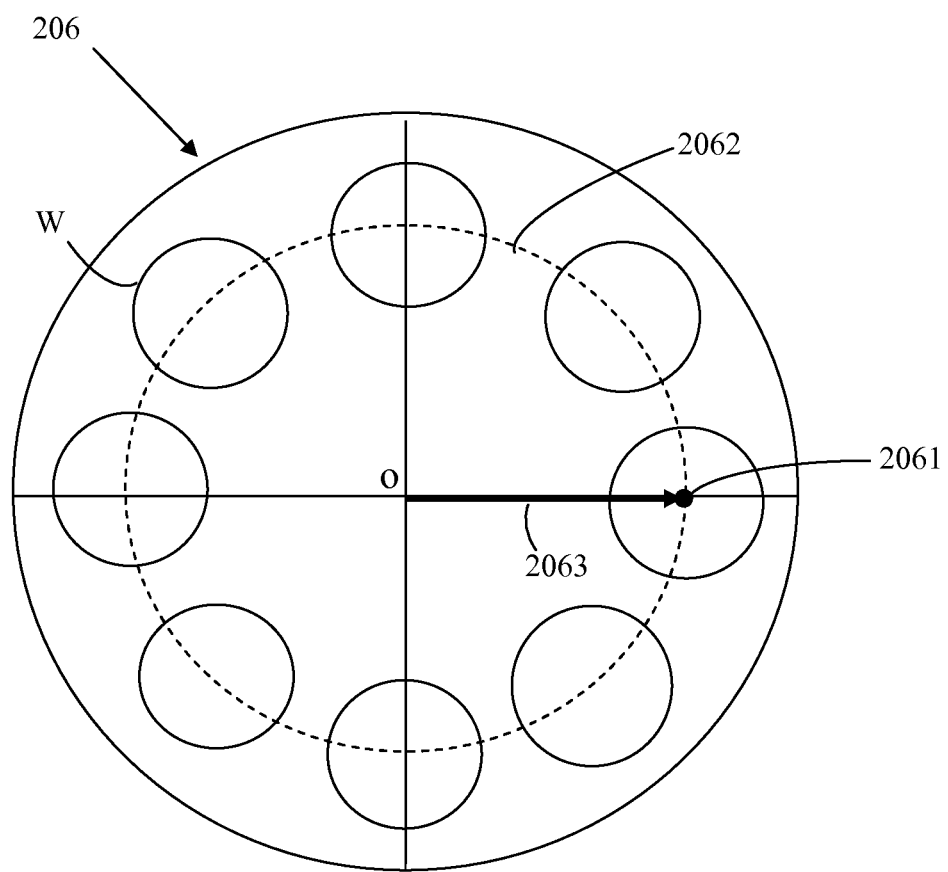
FIG. 6 is a schematic top view of a susceptor and substrates in an MOCVD reactor according to an embodiment of the invention.

FIG. 6 is a schematic top view of a susceptor and substrates in an MOCVD reactor according to an embodiment of the invention. As shown in FIG. 6, in order to place the substrates as many as possible, multiple substrates W are placed in grooves or accesses (not shown) on the susceptor 206 radially, and the grooves or accesses correspond to the substrates one by one. The substrate may have different size, such as 2 cun, 4 cun, 6 cun or 12 cun. A lens 202 as shown in FIG. 2 is provided above the observation opening 201 which is above the measurement point 2061 on the susceptor 206 in the vertical direction. The susceptor 206 rotates under the driving of the rotation shaft 208. As an example, each substrate W rotates in a high speed with respect to the rotation shaft 208 in the rotation path 2062. When the susceptor 206 rotates in a high speed, the measurement point 2061 is fixed and in a position that is away from the center O of the susceptor 206 by a radius distance 2063.

It is assumed that the susceptor 206 or the rotation shaft 208 is rotated in the speed of 1000 revolutions per minute, and 8 substrates W are placed uniformly on the susceptor 206, then there will be one substrate W passing through the measurement point 2061 every $$\frac{60}{1000} \times \frac{1}{8} = 0.0075 \text{ second.}$$

second. Therefore, in the embodiment, the related means are controlled to perform the above measurement method every 0.0075 second, thus the temperature of the substrates on the susceptor 206 can be obtained sequentially.

The measurement method further includes the following steps.

The calculated substrate temperature is compared with a reference substrate temperature pre-stored in the calculating and analyzing means 2046. If the calculated substrate temperature is greater than the pre-stored substrate temperature, the calculating and analyzing means 2046 sends a control signal to the reactor, to make the reactor control the heating means 207 in the reactor to decrease the current temperature of the substrate. If the calculated substrate temperature is less than the pre-stored substrate temperature, the calculating and analyzing means 2046 sends a control signal to the reactor, to make the reactor control the heating means 207 in the reactor to increase the current temperature of the substrate.

It is provided a device for determining temperature of a substrate in a vacuum processing apparatus according to a second aspect of the invention, the substrate to be measured is placed on a susceptor in the vacuum processing apparatus for a manufacture process, where the device includes:

a wavelength selecting means, adapted to select i wavelengths from radiance emitted from the susceptor through a substrate, where i is a natural number greater than 1;

a radiant quantity obtaining means, adapted to obtain i pieces of radiance corresponding to the selected i wavelengths; and a calculating and analyzing means, adapted to calculate the temperature of the substrate based on the i pieces of radiance and the i wavelengths, by using the mathematical equation: $E(\lambda_i)=T(d)\times M(\lambda_i,T)$, where $E(\lambda_i)$ is the ith radiant quantity, T(d) is transmittance of the substrate, which is a function of thickness d of a film grown on the substrate, and $M(\lambda_i,T)$ is blackbody radiation equation, which is a function of the ith wavelength $\lambda_i$ and the temperature of the substrate T.

It is to be noted that the above wavelength selecting means, radiant quantity obtaining means and calculating and analyzing means each can be seemed as the means/module/system that can perform the above function, and solutions implemented by hardware, software or a combination thereof that have been used in the above means in the prior art can be used in the invention for achieving the specific function.

Referring to FIG. 4(a), according to a preferable embodiment of the invention, the wavelength selecting means includes the lenses 202 and 202a-202b, the spectroscope 2010, the filters 2041a-2041b, the sensors 2042a-2042b, the amplifiers 2043a-2043b, the A/D converters 2044a-2044b and the FPGA 2045, the radiant quantity obtaining means includes the lens 202 and 202a-202b, the spectroscope 2010, the filters 2041a-2041d, the sensors 2042a-2042b, the amplifiers 2043a-2043b, the A/D converters 2044a-2044b and the FPGA 2045, and the calculating and analyzing means is typically the calculating and analyzing means 2046 shown in FIG. 4(a).

Referring to FIG. 4(b), according to a variation of the above embodiment, the wavelength selecting means includes the lenses 202' and 202a'-202b', the optical fiber 203, the filters 2041a'-2041b', the sensors 2042a'-2042b', the amplifiers 2043a-2043b, the filters 2041c-2041d, the A/D converters 2044a-2044b and the FPGA 2045, the radiant quantity obtaining means includes the lenses 202' and 202a'-202b', the optical fiber 203, the filters 2041a'-2041b', the amplifiers 2043a-2043b, the filters 2041c-2041d, the A/D converters 2044a-2044b and the FPGA 2045, and the calculating and analyzing means is typically the calculating and analyzing means 2046 shown in FIG. 4(b).

The integral configuration, function architecture and the signal flow of the above hardware have been described in detail above, and are not described here for concision.

It is provided a device for determining temperature of a substrate in a vacuum processing apparatus according to a third aspect of the invention, the substrate to be measured is placed on a susceptor in the vacuum processing apparatus for a manufacture process, the vacuum processing apparatus includes a chamber, and an observation opening is provided on the top of the chamber, where the device includes:

an optical module, adapted to select i wavelengths from radiance emitted from the susceptor through a substrate, obtain at least i pieces of radiance corresponding to the selected i wavelengths, and convert an optical signal containing the i wavelengths and the i pieces of radiance into an electrical signal, where i is a natural number greater than 1;

an analog module, adapted to amplify and de-noise the electrical signal;

a digital synchronization module, adapted to perform a Digital to Analog (D/A) conversion and synchronization on the amplified and de-noised electrical signal; and a calculating and analyzing means in which a mathematical equation of $E(\lambda_i)=T(d)\times M(\lambda_i,T)$ is pre-stored, where the calculating and analyzing means is adapted to calculate the temperature of the substrate based on the i pieces of radiance and the i wavelengths, by using the mathematical equation: $E(\lambda_i)=T(d)\times M(\lambda_i,T)$, where $E(\lambda_i)$ is the ith radiant quantity, T(d) is transmittance of the substrate, which is a function of thickness d of a film grown on the substrate, and $M(\lambda_i,T)$ is blackbody radiation equation, which is a function of the ith wavelength $\lambda_i$ and the substrate temperature T.

Optically, the optical module includes:

a first lens, provided above the observation opening, and adapted to converge, direct and transmit, to a spectroscope, the radiance emitted from the susceptor through a substrate;

i−1 spectroscopes, adapted to divide the optical signal containing the radiance transmitted from the lens into optical signals in different wavelength intervals;

i filters, adapted to select i wavelengths from the optical signals containing different wavelengths divided by the spectroscopes, and obtain, from the optical signals, at least i pieces of radiance corresponding to the selected i wavelengths;

i second lenses, adapted to converge and direct, to a plurality of sensors, the optical signals containing the i wavelengths and the at least i pieces of radiance corresponding to the i wavelengths; and i sensors, adapted to convert the optical signals transmitted from the i second lenses into electrical signals respectively, where the i filters, the i second lenses, and the i sensors are divided into i groups, one filter, one second lens and one sensor are connected in series in this order in each group, and the i groups output in parallel i electrical signals containing the i wavelengths and the at least i pieces of radiance corresponding to the i wavelengths.

Optically, the optical module includes:

a lens, provided above the observation opening, and adapted to converge, direct and transmit, to a fiber, the radiance emitted from the susceptor through a substrate;

an optical fiber, connected to the lens, and adapted to transmit the radiance transmitted from the lens to i filters;

the i filters, adapted to select i wavelengths from the optical signals containing the radiance, and obtain at least i pieces of radiance corresponding to the selected i wavelengths from the optical signals; and i sensors, adapted to convert the optical signals transmitted from the filters into electrical signals respectively, where the i filters and the i sensors are divided into i groups, one filter and one sensor are connected in series in this order in each group, and the i groups output in parallel i electrical signals containing the i wavelengths and the at least i pieces of radiance corresponding to the i wavelengths.

The analog module includes:

i amplifiers, adapted to amplify the electrical signals transmitted from the optical module; and i filters, adapted to de-noise the amplified electrical signals, where the i amplifiers and the i filters are divided into i groups, one amplifier and one filter are connected in series in this order in each group, and the i groups output in parallel i analog electrical signals containing the i wavelengths and the at least i pieces of radiance corresponding to the i wavelengths.

The digital synchronization module includes:

i Analog to Digital (A/D) converters, connected to the analog module and adapted to convert analog electrical signals transmitted from the analog module into digital signals respectively; and a Field Programmable Gate Array (FPGA), connected to the i A/D converters and adapted to synchronize the digital signals.

Optically, referring to FIG. 4(a), according to an embodiment of the invention, the optical module 2047 includes:

a first lens 202, provided above the observation opening 201, and adapted to converge, direct and transmit to a spectroscope 2010 the radiance emitted from the susceptor 206 through a substrate W;

the spectroscope 2010, connected to the first lens 202, and adapted to divide the optical signal containing the radiance transmitted from the first lens 202 into optical signals in different wavelength intervals;

first filters 2041a and 2041b, connected to the spectroscope 2010, and adapted to select i wavelengths from the optical signals containing different wavelengths divided by the spectroscope, and obtain at least i pieces of radiance corresponding to the selected i wavelengths from the optical signals;

second lenses 202a and 202b, connected to the first filters 2041a and 2041b respectively, and adapted to converge and direct, to sensors 2042a and 2042b, the optical signals containing the i wavelengths and the at least i pieces of radiance corresponding to the i wavelengths; and the sensors 2042a and 2042b, adapted to convert the optical signals transmitted from the second lenses 202a and 202b into electrical signals respectively.

Optically, referring to FIG. 4(b), according to another embodiment of the invention, the optical module 2047' includes:

a first lens 202', provided above the observation opening, and adapted to converge, direct and transmit to an optical fiber radiance emitted from the susceptor 206 through a substrate W;

the optical fiber 203, connected to the first lens 202', and adapted to transmit to multiple first filters 2041a'-2041b' the radiance transmitted from the first lens 202';

the first filters 2041a'-2041b', adapted to select i wavelengths from optical signals containing the radiance, and obtain at least i pieces of radiance corresponding to the selected i wavelengths from the optical signals; and sensors 2042a'-2042b', adapted to convert the optical signals transmitted from the first filters 2041a'-2041b' into electrical signals respectively.

Further, the analog module 2048 includes:

amplifiers 2043a-2043b, adapted to amplify the electrical signals transmitted from the optical module 2047; and second filters 2041c-2041d, connected to the amplifiers 2043a-2043b respectively, and adapted to de-noise the amplified electrical signals.

Further, the digital synchronization module 2049 includes:

Analog to Digital (A/D) converters 2044a-2044b, connected to the analog module 2048 and adapted to convert the electrical signals transmitted from the analog module 2048 into digital signals respectively; and a Field Programmable Gate Array (FPGA) 2045, connected to the A/D converters 2044a-2044b and adapted to synchronize the digital signals.

The function and the calculation process of the measurement device according to the third aspect of the invention is the same as those of the first and second aspects and thus has been describe in detail in the first and second aspects, which will not be described here for concision.

For example, according to another embodiment of the invention, the invention can also be applied to a plasma etcher. The application of the invention in the etcher is different from that in the MOCVD reactor in that only one substrate is provided on the susceptor positioned in the center of the chamber, because only one substrate is processed for the manufacture process in the etcher. Accordingly, the observation opening should also be provided in the center of the top of the chamber. However, the functional structure of each means and the calculation process of the substrate temperature in the embodiment are the same as those in the MOCVD embodiment, and thus are not described in detail for concision.

It should be understood by those skilled in the art that solutions implemented by hardware, software and a combination thereof that have been used in the above means in the prior art can be used in the invention for achieving the specific function, which will not be described in detail for concision.

Figure 7:
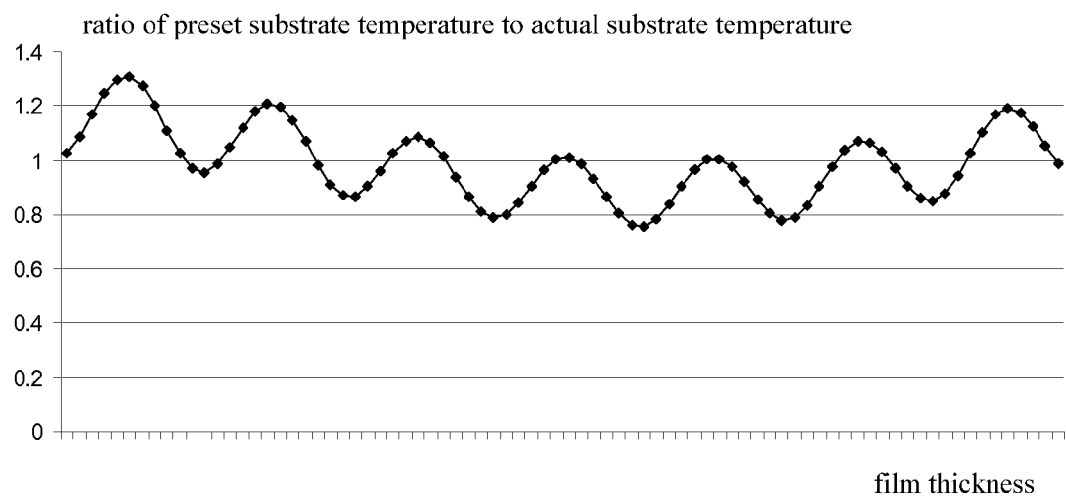
FIG. 7 is a schematic graph of a technical effect of the temperature measurement mechanism in the prior art.

FIG. 7 shows the technical effect of the prior art. The x-coordinate represents the thickness of the film grown on the substrate, and the y-coordinate represents the ratio of the reference substrate temperature to the actual substrate temperature. It can be seen that when the actual substrate temperature approximates to the reference substrate temperature, the y-coordinate value approximates to 1. Referring to FIG. 7, as more films are grown by epitaxy on the substrate during the MOCVD manufacture process and thus the substrate has the structure including a base material and multiple films, the curve swings significantly near the y-coordinate value 1. The average difference between the actual substrate temperature and the reference substrate temperature is greater than 25%, even up to 30%-40%. Therefore, the mechanism for measuring the substrate temperature in the prior art is extremely unreliable, has low accuracy and will generate big error. However, the control of the substrate temperature is very important, particularly in the MOCVD manufacture process, and the stability and accuracy of the substrate temperature will directly affect the effect of the manufacture process.

Figure 8:
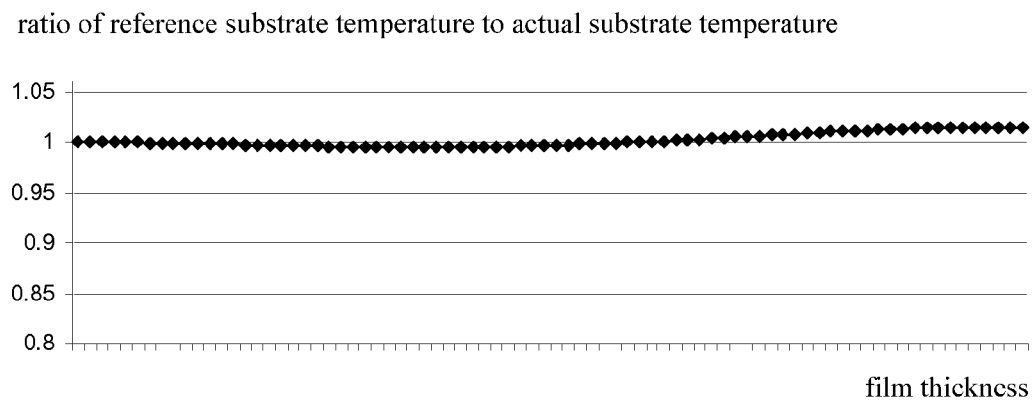
FIG. 8 is a schematic graph of a technical effect of the temperature measurement mechanism according to the invention.

FIG. 8 shows the technical effect of the invention. The x-coordinate represents the thickness of the film grown on the substrate, and the y-coordinate represents the ratio of the reference substrate temperature to the actual substrate temperature. It can be seen that when the actual substrate temperature approximates to the reference substrate temperature, the y-coordinate value approximates to 1. Referring to FIG. 8, as more films are grown by epitaxy on the substrate during the MOCVD manufacture process and thus the substrate has the structure including a base material and multiple films, the curve will follow the y-coordinate value 1 with a fluctuation of small amplitude. The difference between the actual substrate temperature and the reference substrate temperature is within a controllable range, and the error can be ignored. Therefore, the temperature control mechanism of the invention is efficient, reliable and has a high accuracy.

Further, in the invention, the measurement of the substrate temperature is not based on the reflection principle, thus the temperature measurement in the invention will not be affected, even if the centrifugal force caused by the high-speed rotation of the susceptor causes the substrate placed in the groove or access of the susceptor to slope, or the surface of the substrate is uneven because patterns are generated on the surface of the substrate due to multiple films grown on the substrate by epitaxy during the manufacture process.

The content of the invention have been described in detail in conjunction with the above preferable embodiments. However, it should be understood that the above description should not be considered as to limit the invention. It is obvious that many modifications and substitutions can be made by those skilled in the art after reading the above content. Therefore, the protection scope of the invention should be defined by the appended claims.

The invention claimed is:

1. A method for determining a temperature of a substrate in a vacuum processing apparatus, the substrate to be measured being placed on a susceptor in the vacuum processing apparatus for a manufacture process, wherein the method comprises:
    selecting i wavelengths from radiance emitted from the susceptor through the substrate, wherein i is a natural number greater than 1;
    obtaining at least i pieces of radiance corresponding to the selected i wavelengths; and
    calculating the temperature of the substrate based on the i pieces of radiance and the i wavelengths, by using a mathematical equation:

$$E(\lambda_i)=T(d){\times}M(\lambda_i,T),$$

wherein $\lambda_i$ is the i th wavelength, T is the temperature of the substrate, $E(\lambda_i)$ is an i th radiant quantity corresponding to the i th wavelength $\lambda_i$, T(d) is transmittance of the substrate, which is a function of thickness d of a film grown on the substrate, and $M(\lambda_i,T)$ is blackbody radiation equation, which is a function of the i th wavelength $\lambda_i$ and the temperature of the substrate T.

2. The method according to claim 1, wherein
the vacuum processing apparatus comprises a Metal-Organic Chemical Vapor Deposition (MOCVD) reactor, and
at least one film is grown on the substrate by epitaxy in the manufacture process, so that the substrate has a structure including a base material and the at least one film.

3. The method according to claim 1, wherein the blackbody radiation equation is:

$$M(\lambda_i, T) = \frac{2\pi hc^2}{\lambda^5} \frac{1}{e^{hc/\lambda kT} - 1},$$

wherein h is Planck constant, c is light speed, and k is Boltzmann constant.

4. The method according to claim 3, wherein the transmittance of the substrate is determined by:

$$T(d)=1-R,$$

wherein R is a refractive index,
the refractive index is determined by:

$$R=rr^*,$$

wherein r is amplitude reflectance, and r* is conjugation of r,
the amplitude reflectance is determined by:

$$r = \frac{n_0 - Y}{n_{0+}Y},$$

wherein $n_0$ is a refractive index of a medium in which the radiance is transmitted through the substrate, and Y is an equivalent refractive index:

$$Y = \frac{B}{C},$$

wherein B and C are determined by the following matrix:

$$\binom{B}{C} = \begin{pmatrix} \cos\delta_1 & \frac{i\sin\delta_1}{\eta_1} \\ i\eta_1\sin\delta_1 & \cos\delta_1 \end{pmatrix} \binom{1}{\eta_2},$$

wherein $\eta_1$ and $\eta_2$ are determined by:
for a p-component, $\eta_1=n_1/\cos\theta$, and $\eta_2=n_2/\cos\theta$; and
for a s-component, $\eta_1=n_1\cos\theta$, and $\eta_2=n_2\cos\theta$, θ is an angle between a direction in which the radiance is obtained and a normal, and $\delta_1$ is determined by:

$$\delta_1 = \frac{2\pi n_1 d_1}{\lambda_i}\cos\theta,$$

wherein $d_1$ represents thickness of a top film on the substrate, $\lambda_i$ represents the i th wavelength selected from the radiance, $n_1$ represents a refractive index of the top film on the substrate, and $n_2$ represents an equivalent refractive index of a base material and films except the top film of the substrate.

5. The method according to claim 4, further comprising:
selecting any two wavelengths from the i wavelengths, wherein i is equal to or greater than 3; and
obtaining $C_i^2$ substrate temperature values T and $C_i^2$ film thickness values d, by substituting the selected two wavelengths for the wavelength in the mathematical equation:

$$E(\lambda_i)=T(d){\times}M(\lambda_i,T).$$

6. The method according to claim 5, further comprising:
comparing the temperature of the substrate with a pre-stored reference substrate temperature; and
controlling a heater in the vacuum processing apparatus to adjust the current temperature of the substrate.

7. A device for determining a temperature of a substrate in a vacuum processing apparatus, the substrate to be measured being placed on a susceptor in the vacuum processing apparatus for a manufacture process, wherein the device comprises:
    a wavelength selecting means, adapted to select i wavelengths from radiance emitted from the susceptor through the substrate, wherein i is a natural number greater than 1;
    a radiant quantity obtaining means, adapted to obtain at least i pieces of radiance corresponding to the selected i wavelengths; and
    a calculating and analyzing means, adapted to calculate the temperature of the substrate based on the i pieces of radiance and the i wavelengths, by using a mathematical equation:

$$E(\lambda_i)=T(d){\times}M(\lambda_i,T),$$

wherein $\lambda_i$ is the i th wavelength, T is the temperature of the substrate, $E(\lambda_i)$ is an i th radiant quantity corresponding to the i th wavelength $\lambda_i$, T(d) is transmittance of the substrate, which is a function of thickness d of a film grown on the substrate, and $M(\lambda_i,T)$ is blackbody radiation equation, which is a function of the i th wavelength $\lambda_i$ and the temperature of the substrate T.

8. The device according to claim 7, wherein
the vacuum processing apparatus comprises a Metal-Organic Chemical Vapor Deposition (MOCVD) reactor, and
at least one film is grown on the substrate by epitaxy in the manufacture process, so that the substrate has a structure including a base material and the at least one film.

9. The device according to claim 7, wherein the blackbody radiation equation is:

$$M(\lambda_i, T) = \frac{2\pi hc^2}{\lambda^5} \frac{1}{e^{hc/\lambda kT} - 1},$$

wherein h is Planck constant, c is light speed, and k is Boltzmann constant.

10. The device according to claim 9, wherein the transmittance of the substrate is determined by:

$$T(d)=1-R,$$

wherein R is a refractive index, the refractive index is determined by:

$$R=rr^*,$$

wherein r is amplitude reflectance, and r* is conjugation of r, the amplitude reflectance is determined by:

$$r = \frac{n_0 - Y}{n_{0+}Y},$$

wherein $n_0$ is a refractive index of a medium in which the radiance is transmitted through the substrate, and Y is an equivalent refractive index:

$$Y = \frac{B}{C},$$

wherein B and C are determined by the following matrix:

$$\begin{pmatrix} B \\ C \end{pmatrix} = \begin{pmatrix} \cos\delta_1 & \frac{i\sin\delta_1}{\eta_1} \\ i\eta_1\sin\delta_1 & \cos\delta_1 \end{pmatrix} \begin{pmatrix} 1 \\ \eta_2 \end{pmatrix},$$

wherein $\eta_1$ and $\eta_2$ are determined by:
for a p-component, $\eta_1=n_1/\cos\theta$, and $\eta_2=n_2/\cos\theta$; and
for a s-component, $\eta_1=n_1\cos\theta$, and $\eta_2=n_2\cos\theta$,
$\theta$ is an angle between a direction in which the radiance is obtained and a normal, and $\delta_1$ is determined by:

$$\delta_1 = \frac{2\pi n_1 d_1}{\lambda_i}\cos\theta,$$

wherein $d_1$ represents thickness of a top film on the substrate, $\lambda_i$ represents the i th wavelength selected from the radiance, $n_1$ represents a refractive index of the top film on the substrate, and $n_2$ represents an equivalent refractive index of a base material and films except the top film of the substrate.

11. The device according to claim 10, wherein the calculating and analyzing means is connected to a Metal-Organic Chemical Vapor Deposition reactor, and is further adapted to:
select any two wavelengths from the i wavelengths, wherein i is equal to or greater than 3; and
obtain $C_i^2$ substrate temperature values T and $C_i^2$ film thicknesses values d, by substituting the selected two wavelengths for the wavelength in the mathematical equation:

$$E(\lambda_i)=T(d)\times M(\lambda_i,T).$$

12. The device according to claim 11, wherein
a reference substrate temperature is pre-stored in the calculating and analyzing means, and
the calculating and analyzing means is further adapted to:
compare the temperature of the substrate with the pre-stored reference substrate temperature; and
control a heater in the vacuum processing apparatus to adjust the current temperature of the substrate.

13. A device for determining a temperature of a substrate in a vacuum processing apparatus, the substrate to be measured being placed on a susceptor in the vacuum processing apparatus for a manufacture process, the vacuum processing apparatus comprising a chamber, and an observation opening being provided on the top of the chamber, wherein the device comprises:
an optical module, adapted to select i wavelengths from radiance emitted from the susceptor through the substrate, obtain at least i pieces of radiance corresponding to the selected i wavelengths, and convert an optical signal containing the i wavelengths and the i pieces of radiance into an electrical signal, wherein i is a natural number greater than 1;
an analog module, adapted to amplify and de-noise the electrical signal;
a digital synchronization module, adapted to perform Analog to Digital (A/D) conversion and synchronization on the amplified and de-noised electrical signal; and
a calculating and analyzing means in which a mathematical equation of $E(\lambda_i)=T(d)\times M(\lambda_i,T)$ is pre-stored, wherein the calculating and analyzing means is adapted to calculate the temperature of the substrate based on the i pieces of radiance and the i wavelengths, by using the mathematical equation:

$$E(\lambda_i)=T(d)\times M(\lambda_i,T),$$

wherein $\lambda_i$ is the i th wavelength, T is the temperature of the substrate, $E(\lambda_i)$ is an i th radiant quantity corresponding to the i th wavelength $\lambda_i$, T (d) is transmittance of the substrate, which is a function of thickness d of a film grown on the substrate, and $M(\lambda_i,T)$ is blackbody radiation equation, which is a function of the i th wavelength $\lambda_i$ and the temperature of the substrate T.

14. The device according to claim 13, wherein the optical module comprises:
a first lens, provided above the observation opening, and adapted to converge, direct and transmit to spectroscopes the radiance emitted from the susceptor through a substrate;
i-1 spectroscopes, adapted to divide the optical signal containing the radiance transmitted from the first lens into optical signals in different wavelength intervals;
i filters, adapted to select i wavelengths from the optical signals containing different wavelengths divided by the spectroscopes, and obtain at least i pieces of radiance corresponding to the selected i wavelengths from the optical signals;
i second lenses, adapted to converge and direct, to a plurality of sensors, the optical signals containing the i wavelengths and the at least i pieces of radiance corresponding to the i wavelengths; and
i sensors, adapted to convert the optical signals transmitted from the i second lenses into electrical signals respectively,
wherein the i filters, the i second lenses, and the i sensors are divided into i groups, one filter, one second lens and one sensor are connected in series in this order in each group, and the i groups output in parallel i electrical signals containing the i wavelengths and the at least i pieces of radiance corresponding to the i wavelengths,
or, the optical module comprises:
a lens, provided above the observation opening, and adapted to converge, direct and transmit to a fiber the radiance emitted from the susceptor through a substrate;

an optical fiber, connected to the lens, and adapted to transmit the radiance transmitted from the lens to i filters;

the i filters, adapted to select i wavelengths from the optical signal containing the radiance, and obtain at least i pieces of radiance corresponding to the selected i wavelengths from the optical signal; and i sensors, adapted to convert the optical signals transmitted from the i filters into electrical signals respectively, wherein the i filters and the i sensors are divided into i groups, one filter and one sensor are connected in series in this order in each group, and the i groups output in parallel i electrical signals containing the i wavelengths and the at least i pieces of radiance corresponding to the i wavelengths.

15. The device according to any one of claims 13, wherein the analog module comprises:

i amplifiers, adapted to amplify the electrical signals transmitted from the optical module; and i filters, adapted to de-noise the amplified electrical signals, wherein the i amplifiers and the i filters are divided into i groups, one amplifier and one filter are connected in series in this order in each group, and the i groups output in parallel i analog electrical signals containing the i wavelengths and the at least i pieces of radiance corresponding to the i wavelengths.

16. The device according to claim 15, wherein the digital synchronization module comprises:

i Analog to Digital (A/D) converters, connected to the analog module and adapted to convert the analog electrical signals transmitted from the analog module into digital signals respectively; and a Field Programmable Gate Array (FPGA), connected to the i Analog to Digital converters and adapted to synchronize the digital signals.

17. The device according to claim 16, wherein the blackbody radiation equation is:

$$M(\lambda_i, T) = \frac{2\pi hc^2}{\lambda^5} \frac{1}{e^{hc/\lambda kT} - 1},$$

wherein h is Planck constant, c is light speed, and k is Boltzmann constant.

18. The device according to claim 17, wherein the transmittance of the substrate is determined by:

$$T(d) = 1 - R,$$

wherein R is a refractive index, the refractive index is determined by:

$$R = rr^*,$$

wherein r is amplitude reflectance, and $r^*$ is conjugation of r, the amplitude reflectance is determined by:

$$r = \frac{n_0 - Y}{n_{0+} Y},$$

wherein $n_0$ is a refractive index of a medium in which the radiance is transmitted through the substrate, and Y is an equivalent refractive index:

$$Y = \frac{B}{C},$$

wherein B and C are determined by the following matrix:

$$\begin{pmatrix} B \\ C \end{pmatrix} = \begin{pmatrix} \cos\delta_1 & \frac{i\sin\delta_1}{\eta_1} \\ i\eta_1 \sin\delta_1 & \cos\delta_1 \end{pmatrix} \begin{pmatrix} 1 \\ \eta_2 \end{pmatrix},$$

wherein $\eta_1$ and $\eta_2$ are determined by:

for a p-component, $\eta_1 = n_1/\cos\theta$, and $\eta_2 = n_2/\cos\theta$; and for a s-component, $\eta_1 = n_1 \cos\theta$, and $\eta_2 = n_2 \cos\theta$, $\theta$ is an angle between a direction in which the radiance is obtained and a normal, and $\delta_1$ is determined by:

$$\delta_1 = \frac{2\pi n_1 d_1}{\lambda_i} \cos\theta,$$

wherein $d_1$ represents thickness of a top film on the substrate, $\lambda_i$ represents the i th wavelength selected from the radiance, $n_1$ represents a refractive index of the top film on the substrate, and $n_2$ represents an equivalent refractive index of a base material and films except the top film of the substrate.

19. The device according to claim 18, wherein the calculating and analyzing means is connected to a Metal-Organic Chemical Vapor Deposition reactor, and is further adapted to:

select any two wavelengths from the i wavelengths, wherein i is equal to or greater than 3; and obtain $C_i^2$ substrate temperature values T and $C_i^2$ film thickness values d, by substituting the selected two wavelengths for the wavelength in the mathematical equation:

$$E(\lambda_i) = T(d) \times M(\lambda_i, T).$$

20. The device according to claim 19, wherein a reference substrate temperature is pre-stored in the calculating and analyzing means, and the calculating and analyzing means is further adapted to:

compare the temperature of the substrate with the reference substrate temperature; and control the vacuum processing apparatus to adjust the current temperature of the substrate.

* * * * *